United States Patent
Maloberti et al.

(10) Patent No.: US 7,107,175 B2
(45) Date of Patent: Sep. 12, 2006

(54) CONTINUOUS DIGITAL BACKGROUND CALIBRATION IN PIPELINED ADC ARCHITECTURE

(75) Inventors: Franco Maloberti, Plano, TX (US); Martin Kithinji Kinyua, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/251,668

(22) Filed: Oct. 17, 2005

(65) Prior Publication Data

US 2006/0031037 A1    Feb. 9, 2006

Related U.S. Application Data

(62) Division of application No. 10/738,751, filed on Dec. 17, 2003, now Pat. No. 7,035,756.

(51) Int. Cl.
*G06F 19/00* (2006.01)
*H03M 1/10* (2006.01)

(52) U.S. Cl. .............. 702/126; 341/118; 341/120; 341/131; 341/161; 702/85; 702/89; 702/125; 702/127

(58) Field of Classification Search ............ 702/61, 702/68, 89, 85, 107, 124, 126, 127, 198; 341/118, 120, 131, 156, 161
See application file for complete search history.

(56) References Cited

U.S. PATENT DOCUMENTS

| | | | | |
|---|---|---|---|---|
| 6,473,012 B1 * | 10/2002 | Hellberg et al. | ............ | 341/120 |
| 6,556,158 B1 * | 4/2003 | Steensgaard-Madsen | .... | 341/131 |
| 6,784,814 B1 * | 8/2004 | Nair et al. | ................ | 341/118 |
| 6,822,601 B1 * | 11/2004 | Liu et al. | ................... | 341/161 |

\* cited by examiner

*Primary Examiner*—Michael Nghim
*Assistant Examiner*—John Le
(74) *Attorney, Agent, or Firm*—W. James Brady, III; Frederick J. Telecky, Jr.

(57) ABSTRACT

Disclosed are new methods and systems for achieving calibration in a pipelined ADC system. The methods and systems may be used to provide continuous digital background calibration in a pipelined ADC. Component mismatch error from each DAC in the pipeline is tabulated to provide an integral nonlinearity profile, which is subtracted from the ADC transfer characteristic.

2 Claims, 3 Drawing Sheets

CONTINUOUS DIGITAL BACKGROUND CALIBRATION IN PIPELINED ADC ARCHITECTURE

This application claims priority under 35 USC §120 of application Ser. No. 10/738,751, filed Dec. 17, 2003 now U.S. Pat. No. 7,035,756. This application is a divisional of the above mentioned application.

TECHNICAL FIELD

The invention relates to analog-to-digital conversion, hereinafter ADC, in electronic signal processing. More particularly, the invention relates to methods and systems for calibration in a pipelined ADC system.

BACKGROUND OF THE INVENTION

The pipelined ADC is a popular ADC system architecture used in a wide variety of applications including for example, digital imaging, data transmission, and wireless communications. In general, an analog input signal is sampled and held while a first stage quantizes the sample into digital bits. The digitized sample is then fed into a digital-to-analog converter, hereinafter DAC, and the resulting analog output is subtracted from the original sample. The residue thus obtained is then typically gained up by a desired gain factor and passed to a next similar stage. The process is repeated as the sample continues through additional stages of the pipeline. Since the bits from each stage are determined at different times, all of the bits corresponding to a given sample are corrected for time-alignment, typically using shift registers, prior to being output.

Quantization error inevitably results from the conversion of the input signal sample. An ideal ADC output may be described in terms of the formula: $y=x_{in}+\epsilon_Q$ [Equation 1], where $x_{in}$ is the input signal, and $\epsilon_Q$ is the inherent conversion uncertainty, or quantization error. Various problems arise in the implementation of pipelined ADCs, however, causing departure from the ideal. Additional errors are caused in large part by nonlinearities introduced by circuit component mismatch. In switched-capacitor ADC implementations, for example, inherent capacitor mismatch in the DAC is a major source of error. In switched-current implementations, resistor mismatch is a major error source. In general, for high accuracy in pipelined ADCs, some form of error correction is required.

Forms of error correction known in the arts include element trimming. One-time element trimming is simply the testing and adjustment of the ADC system to compensate for component mismatch. A major shortcoming of element trimming, as with any one-time error correction technique, is that it is unable to respond to the drift of component values over time, which may cause accuracy to deteriorate. Other disadvantages include the increased test time and additional circuitry required. Other forms of error correction familiar in the arts include element randomization, element shaping, and various techniques for analog and digital calibration. Numerous difficulties remain with such techniques, however, including but not limited to the requirement for additional ADC elements, reduced conversion rates, and inability of non-continuous calibration to adjust for changing conditions.

To address these and other problems, there is a need for improved systems and methods for continuous digital background calibration in pipelined ADC architectures.

SUMMARY OF THE INVENTION

In carrying out the principles of the present invention, in accordance with preferred embodiments thereof, the invention provides systems and methods for correcting errors in a pipelined ADC caused by mismatch in the components used in implementing the DAC function.

The disclosed methods and systems for calibration of a pipelined ADC make use of a pipelined ADC topology, which conforms, to the equation;

$$y(2b_{sc}-1) = \quad\quad\quad\quad\quad\quad\quad\quad\quad\quad\quad\quad\quad\quad \text{[Equation 2]}$$
$$X_{in}(2b_{sc}-1) + \varepsilon_Q(2b_{sc}-1) + \sum_{i \neq k}^{n} \varepsilon_{DAC,i}(2b_{sc}-1) + \varepsilon_k,$$

where:
y is the digital output signal;
$x_{in}$ is an AC input signal;
$\epsilon_Q$ is an inherent quantization error;
$\epsilon_{DAC}$ is a residual error in the DAC elements of the pipelined ADC;
$\epsilon_k$ is an error in a given kth DAC element; and
$b_{sc}$ is a pseudo-random modulation sequence of ones and zeros. The invention also includes means for averaging the digital output $y(2 b_{sc}-1)$ for a selected calibration time in order to obtain a kth DAC error term described by, $<y(2 b_{sc1})>=\epsilon_k$, wherein the kth error terms are summed to produce an integral nonlinearity profile, which is then subtracted from the ADC transfer characteristic to achieve calibration.

According to one aspect of the invention, a method is described in which steps of continuously monitoring the sum of the generated binary modulation signal $b_{sc}$ bits, and maintaining the sum of the $b_{sc}$ bits near zero, permit the calibration to be performed more quickly.

According to another aspect of the invention, a pipelined ADC system has two or more pipeline stages whereby circuitry is provided for sequentially triggering the calibration of each pipeline stage beginning near the tail end and working to the front stage for the duration of a selected calibration cycle.

According to one embodiment of the invention, a self-calibrating pipelined ADC converter system is implemented using a switched-capacitor circuit. The self-calibrating switched-capacitor pipelined ADC circuit has a reference capacitor adapted for sequentially calibrating the other capacitors in that stage.

According to still another aspect of the invention, a self-calibrating pipelined ADC converter system is implemented using a switched-current circuit. The self-calibrating switched-current pipelined ADC circuit has a DAC reference current source adapted for sequentially calibrating the other current sources in that stage.

The invention provides technical advantages over the prior art including but not limited to providing ongoing background self-calibration for improved accuracy in pipelined ADC systems. The preferred embodiments of the invention do not require an extra ADC to digitize the inter-stage DAC mis-match errors. The systems and methods of the invention are capable of converging quickly to a calibration solution and require less test time. These and other features, advantages, and benefits of the present invention can be understood upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

Figure 1:
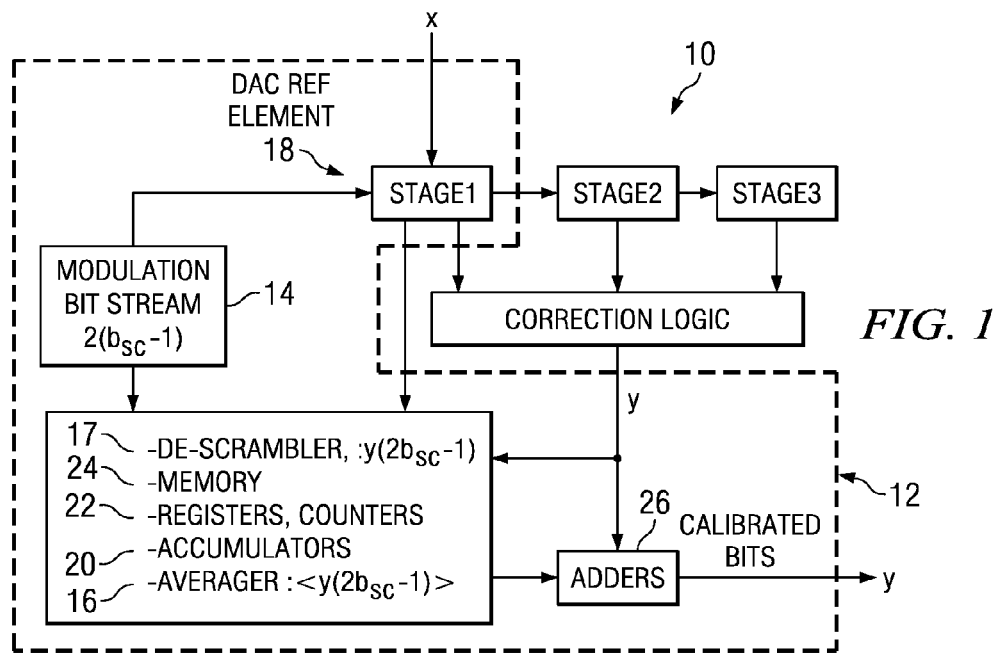
FIG. 1 is a block diagram illustrating examples of preferred embodiments of methods and systems for digital calibration according to the invention.

References in the detailed description correspond to the references in the figures unless otherwise noted. Descriptive and directional terms used in the written description such as first, second, left, right, top, bottom, and so forth refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

A method for continuous digital background calibration of high resolution pipeline ADCs is described in which errors caused by the mismatch of components in the DAC stages are significantly reduced. The general principles, methods and systems of the invention are described herein, along with exemplary preferred embodiments.

Much of the undesirable non-linearity in pipelined ADCs arises in the intermediate digital-to-analog converters, or sub-DACs, used to obtain the stage residue. Expressing this error as $\epsilon_{DAC}$, Equation 1 is modified so that the ADC output can be expressed as, $$y = x_{in} + \varepsilon_Q + \sum_{i=1}^{n} \varepsilon_{DAC,i}. \quad \text{[Equation 3]}$$

It has been determined that Equation 3 may be modified to account for each instance of error introduced by a particular DAC element, herein represented by $\epsilon_k$, that is, the error caused by component mismatch in the kth DAC element, under calibration. Thus, manipulating Equation 3 yields, $$y = x_{in} + \varepsilon_Q + \sum_{i \neq k}^{n} \varepsilon_{DAC,i} + (2b_{sc} - 1)\varepsilon_k. \quad \text{[Equation 4]}$$

The term $b_{sc}$ represents a suitable binary modulation signal. The binary modulation signal is a pseudo-random sequence of ones and zeros with a white noise spectrum and uncorrelated with the quantization error. The average number of ones and zeros of the $b_{sc}$ sequence is made to be or very closely approach zero. Using a binary modulation signal $b_{sc}$ having these characteristics, the term $(2b_{sc}-1)$, also denominated the scrambling bitstream, produces a sequence of ones and negative ones. Modulating Equation 4 by the scrambling bitstream produces the result, $$y(2b_{sc} - 1) = \quad \text{[Equation 5]}$$
$$X_{in}(2b_{sc} - 1) + \varepsilon_Q(2b_{sc} - 1) + \sum_{i \neq k}^{n} \varepsilon_{DAC,i}(2b_{sc} - 1) + \varepsilon_k.$$

It should be understood that it is assumed for the purposes of the description of the invention that the input signal is not zero or constant, i.e. is an AC signal, and that the DAC element error is time invariant within the duration of the calibration cycle.

It has been determined that the topology of a pipeline ADC system can be arranged to conform to the description of Equation 5. It has been further determined that the average of Equation 5 over a selected calibration cycle will yield, $$\langle y(2b_{sc}-1)\rangle = \epsilon_k \quad \text{[Equation 6]}.$$

This can be verified by analyzing the average of Equation 5 further, $$\langle y(2b_{sc} - 1)\rangle = \langle X_{in}(2b_{sc} - 1)\rangle + \quad \text{[Equation 7]}$$
$$\langle \varepsilon_Q(2b_{sc} - 1)\rangle + \left\langle \sum_{i \neq k}^{n} \varepsilon_{DAC,i}(2b_{sc} - 1) \right\rangle + \langle \varepsilon_k \rangle.$$

The first three terms on the right hand side of Equation 6 vanish assuming the scrambling bit-stream (whose average value is zero) is not correlated with the input signal, DAC error, and quantization noise; that is to say they are orthogonal. Since the DAC element error is assumed to be time invariant within the calibration cycle, $\langle \epsilon_k \rangle = \epsilon_k$. Therefore, processing of the digital output (averaging for adequate time) provides a measure of the value of the $k^{th}$ element of the DAC. Equation (7) refers the DAC element value to unity:

$$V_{DAC,k} = 1 + \epsilon_k \quad \text{[Equation 8]}.$$

Preferably, the DAC error differential non-linearity (DNL), in digital form, is summed to yield an integral non-linearity (INL) profile. The INL profile is stored, preferably using a form of read-only memory (RAM) known in the arts. The INL is then subtracted from the raw ADC output transfer characteristic in order to achieve calibration. A look-up table whose address is the raw ADC output of the stage is preferably used to provide the appropriate calibration value.

Now referring primarily to FIG. 1, a conceptual block diagram illustrates an overview of a representative implementation of a three stage pipelined ADC using the invention. A representative pipelined ADC system 10 is shown wherein, for the purposes of this example, only the first stage is being calibrated. The dashed line surrounds the calibration circuitry blocks 12 for implementing the methods and systems of the invention. The circuitry 12 used to achieve calibration includes blocks for performing the functions described, it should be understood that functional blocks and circuitry may be combined or arranged differently from the example portrayed without departure from the invention. A pseudo-random number generator 14 is used to provide the binary modulation signal $b_{sc}$ having the characteristics described herein. An additional block includes digital counters 22, used to sequentially trigger the calibration of each DAC element after a certain number if clock cycles. The number of registers 22 may be determined according to the calibration requirements of the particular pipelined ADC 10, for example, if $2^N$ clock cycles were desired for the calibration of each DAC element, N registers 22 would generally be used. Read-only memory (RAM) 24 is used to store computed mismatch, which is addressed by the digital bits of the stage under calibration. In turn, an averager 16 calculates the mismatch by dividing the accumulators 20 value and the number of samples. i.e., $<y(2b_{sc}-1)>=\epsilon_k$. Preferably, digital computations may be truncated to conserve computation resources without significant loss of accuracy. A de-modulator (de-scrambler 17) is included. A reference DAC analog element 18 is included, and an adder 26 is used to subtract the DAC element mis-match from the overall ADC output.

Figure 2:
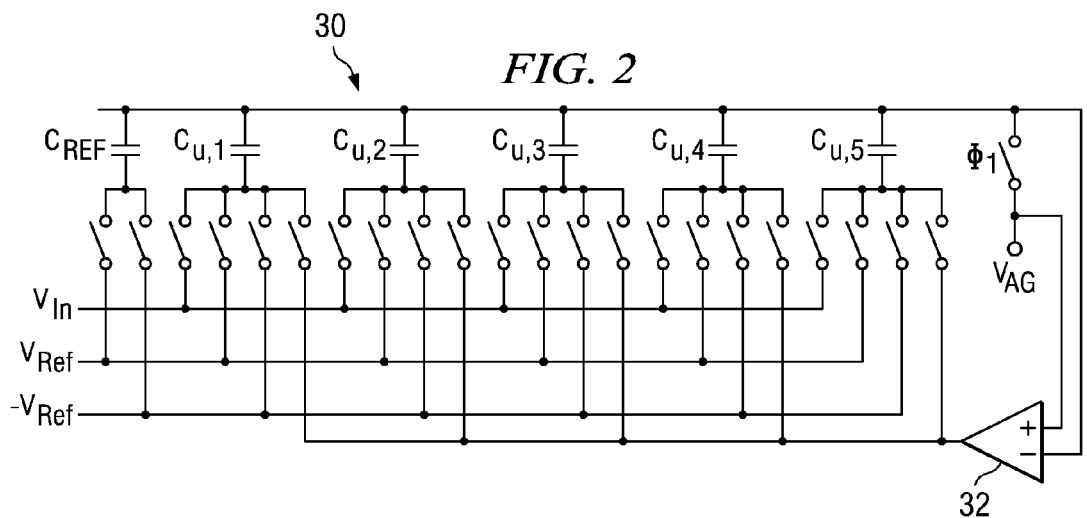
FIG. 2 is a schematic diagram of an example of preferred embodiments of systems and methods of signal calibration using switched capacitors according to the invention.

It should be appreciated that various circuits may be used to implement the principles of the invention. An example of a preferred implementation of a pipelined ADC using the invention implemented in the form of a switched capacitor circuit 30 is shown in FIG. 2. Initially assuming for the sake of illustration that the switches connected to reference capacitor $C_{ref}$ and the fifth capacitor $C_{u,5}$ are left open, consider the operation of the circuit 30. Those skilled in the arts will appreciate that in a conventional single-ended switched capacitor residue generator incorporating a 2-bit DAC, during the operation of phase 1 all the capacitors C sample the input signal $V_{in}$. In turn, during phase 2, by appropriate control of the three corresponding switches, one capacitor is sequentially connected around the op-amp 32 and the remaining three are connected to either $+V_{Ref}$ or $-V_{Ref}$. The capacitors $C_{u,1}$, $C_{u,2}$, $C_{u,3}$ and $C_{u,4}$ are nominally equal. Assuming that $C_{u,4}$ is connected in feedback, the generated residue voltage $V_{Res}$ may be described by, $$V_{Res} = \frac{1}{C_{u,4}}\{(C_{u,1} + C_{u,2} + C_{u,3} + C_{u,4})V_{in} - C_{u,1}V_{R,1} - C_{u,2}V_{R,2} - C_{u,3}V_{R,3}\},$$ [Equation 9]

where $V_{R,1}$, $V_{R,2}$, $V_{R,3}$, are the reference voltages applied to $C_{u,1}$, $C_{u,2}$, $C_{u,3}$ during the operati phase 2.

Now considering the arrangement of the circuit shown in FIG. 2 with the reference capacitor $C_{Ref}$ and the fifth capacitor $C_{u,5}$ operational, the implementation of the invention can be seen. It should be understood that all of the capacitors, $C_{u,1}$, $C_{u,2}$, $C_{u,3}$, and $C_{u,4}$, are sequentially put into a calibration mode. Examination of the circuit 30 reveals that the capacitance in the calibration mode can be switched between $+V_{Ref}$ and $-V_{Ref}$ only with a clocking scheme complementary to the one used for $C_{ref}$; the other capacitors operate exactly as described above. Assuming that $C_{u,5}$ is in the calibration mode, and that it is charged at $V_{Ref}$ during the execution of phase 1 ($C_{Ref}$ is charged at $-V_{Ref}$). The residue voltage becomes, $$V'_{Res} = \frac{1}{C_{u,4}}\{(C_{u,1} + C_{u,2} + C_{u,3} + C_{u,4})V_{in} - C_{u,1}V_{R,1} - C_{u,2}V_{R,2} - C_{u,3}V_{R,3} + (C_{u,5} - C_{Ref})V_{Ref}\}.$$ [Equation 10]

It can be seen that Equation 10 includes the residue voltage, plus a term, $(C_{u,5}-C_{Ref}) V_{Ref}$, that depends on the mismatch between $C_{u,5}$ and $C_{Ref}$ (i.e., the error in the DAC element). If $C_{u,5}$ is in the calibration mode and is charged at $-V_{Ref}$ during the operation of phase 1, the sign of the additional term is reversed. Therefore, $$v'_{Res} = V_{Res} \pm \frac{(C_{u,5} - C_{ref})V_{Ref}}{C_{u,4}}.$$ [Equation 11]

The output of the residual generator shown and described may be generalized as, $$Y'_{res}=Y_{res}+(2X_{mod}-1)\Delta U \cdot K$$ [Equation 12], where $X_{mod}$ is a control bit that determines the sign of the additional contribution and K is a gain factor.

Figure 3:
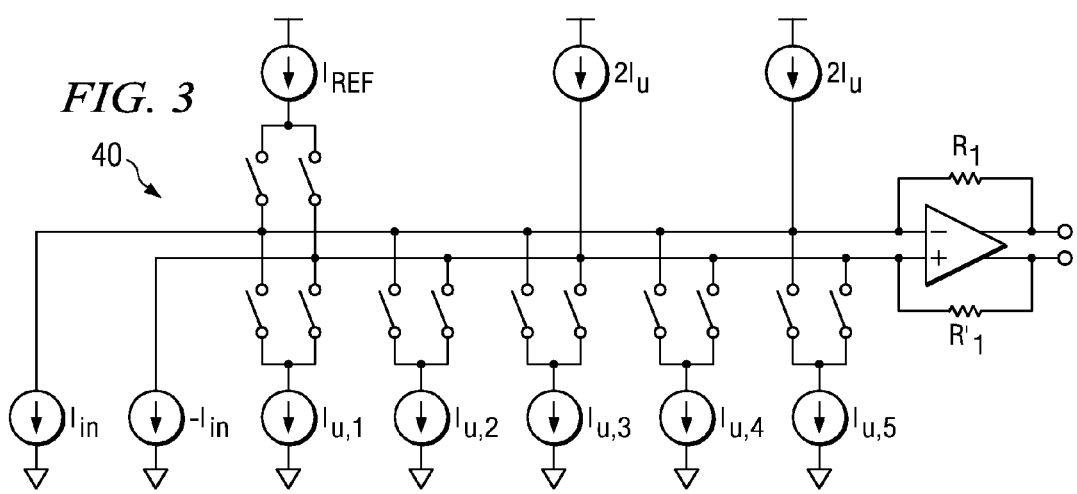
FIG. 3 is a schematic diagram of an example of preferred embodiments of systems and methods of digital calibration using a current-switching circuit according to the invention.

An alternative embodiment of a circuit for implementing the invention is presented in FIG. 3. FIG. 3 shows an example of a circuit embodying the invention in a switched-current implementation 40. Again assuming a pipelined ADC, and in light of the forgoing discussions, it is shown how to measure the mismatch between DAC elements in a pipeline stage. It should be noted that in FIG. 3, five sequentially numbered, switched current paths with current sources, $I_{u,1}$, $I_{u,2}$, $I_{u,3}$, $I_{u,4}$, $I_{u,5}$ have been provided. A reference current source $I_{ref}$ has also been included. The switches are used to control the reference current generator $I_{ref}$ and each sequential unity current element under calibration such that the two currents are injected on the same input terminal. By inspection of the circuit of FIG. 3, it follows that, $$V'_{Res} = V_{Res} \pm (I_{ref} - I_{u,5})\frac{R_1 + R'_1}{2}.$$ [Equation 13]

As described above, by sequential operation of the circuit, the current paths, $I_{u,1}$, $I_{u,2}$, $I_{u,3}$, and $I_{u,4}$, are sequentially put into a calibration mode.

Figure 4:
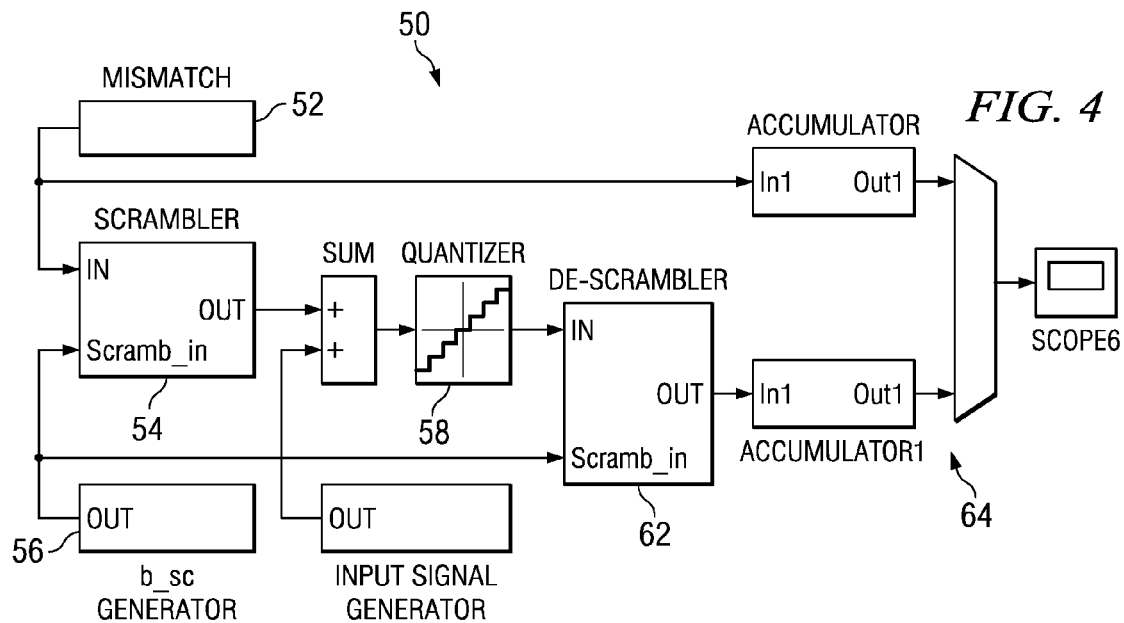
FIG. 4 is a block diagram illustrating examples of preferred embodiments of methods and systems for digital calibration according to the invention.
Figure 5:
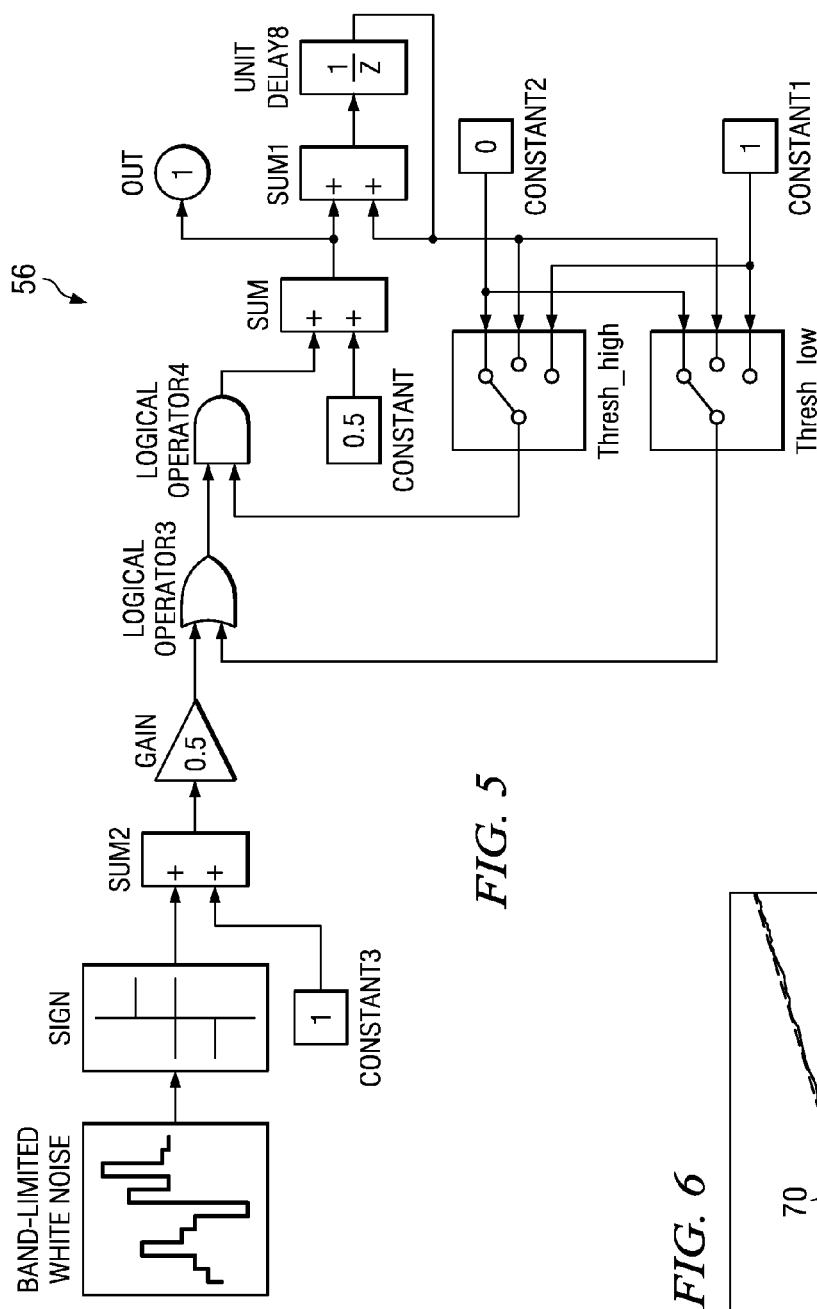
FIG. 5 is a block diagram further illustrating an example of system level operation of a binary modulation signal generator of the invention as depicted in the embodiment shown in FIG. 4.

Further understanding of the practice of the invention may be enhanced by consideration of FIG. 4. FIG. 4 provides a block diagram illustrating the functional blocks of the invention in an example of a system simulation model 50. An arbitrary constant 52 is assigned to simulate a component mismatch, in this case 0.005. The scrambler 54 multiplies the mismatch by either −1 or 1 depending on the polarity of the random bit stream from $b_{sc}$ generator 56, after which, the mismatch 52 is added to the input. The quantizer 58 models the pipelined ADC system 12. After application of the methods of the invention, descrambling 62, and accumulation 64 of the results, a comparison may be made to essentially verify the calibration effects. FIG. 5 is a block diagram further illustrating the steps of the example of FIG. 4 by showing an expanded view of the operation of a binary modulation signal generator 56 according to the invention. The $b_{sc}$ generator 56 generates the scrambling bit-stream. It is designed to provide a pseudo-random bit-stream while ensuring the same number of 1's and 0's within the calibration cycle. Preferably, in the implementation of the invention, the sum of the bits generated by the $b_{sc}$ generator is monitored and the appropriate bits are injected to maintain the sum close to zero. In this way, the calibration algorithm may be made to converge more quickly to the value being calibrated.

Figure 7:
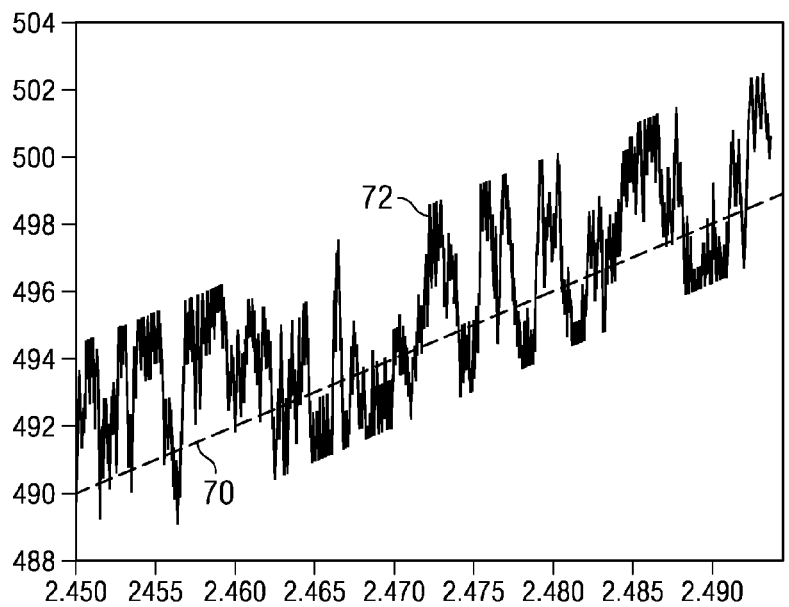
FIG. 7 is a close-up view of a portion depicting an example of results obtained using a preferred embodiment of the digital calibration methods and systems of the invention.
Figure 6:
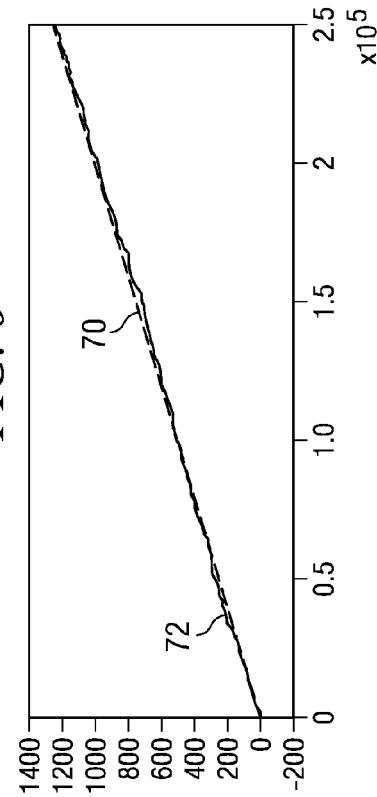
FIG. 6 is a graphical representation of an example of results obtained using a preferred embodiment of the digital calibration methods and systems of the invention.

FIGS. 6 and 7 are graphical representations of an example of simulation results obtained using a simulation set-up as shown in FIGS. 4 and 5 demonstrating the operation of preferred embodiments of the digital calibration methods and systems of the invention. In FIG. 6, the accumulated DAC mismatch values 70 and calibrated values 72 are shown. FIG. 7 shows a close-up view plot of a specific simulation result after 2.5 e5 time points. A component mismatch of 0.002 3 was assumed for the purposes of the simulation (i.e, 9 bit intrinsic matching). The methods of the invention was used to calculate the value as 500(+−4)/2.5e5=−+0.002016, for an overall accuracy of +−0.8%, or $\log_2(0.008)$=6.9658 bits of matching improvement. The accuracy may be further increased, in principle indefinitely, by increasing the calibration interval. The quantizer in this instance was set at 10 bits.

Thus, the invention includes methods and apparatus for the continuous background calibration of pipelined ADCs, for example, switched-capacitor or switched current circuits. Advantages provided by the invention include improved dynamic performance of the ADC (SNR and SFDR), which is particularly desirable in wireless communication applications. Modest additional digital circuitry is required. While the invention has been described with reference to certain illustrative embodiments, the methods and apparatus described are not intended to be construed in a limiting sense. Various modifications and combinations of the illustrative embodiments as well as other advantages and embodiments of the invention will be apparent to persons skilled in the arts upon reference to the description and claims.

The invention claimed is:

1. A method for calibration of a pipelined analog-to-digital converter, ADC, comprising the steps of:

arranging the topology of a pipelined ADC to conform to the equation;

$$y(2b_{sc} - 1) = X_{in}(2b_{sc} - 1) + \varepsilon_Q(2b_{sc} - 1) + \sum_{i \neq k}^{n} \varepsilon_{DAC,i}(2b_{sc} - 1) + \varepsilon_k,$$

where;
y is a digital output signal;
$x_{in}$ is an AC input signal;
$\varepsilon_Q$ is an inherent quantization error;
$\varepsilon_{DAC}$ is a residual error in the digital-to-analog converter, DAC, elements of the pipelined ADC;
$\varepsilon_k$ is an error in a given kth DAC element under calibration;
$b_{sc}$ is a binary modulation signal orthogonal to the input signal and consists of a pseudo-random sequence of ones and zeros with a white noise spectrum;

averaging the digital output $y(2 b_{sc}-1)$ for a selected calibration time in order to obtain a kth error term described by, $<y(2b_{sc}-1)>=\varepsilon_k;$ adding all the k error terms to form an integral nonlinearity profile, INL; and at least once per selected calibration time, subtracting the INL from the ADC transfer characteristic, thereby calibrating the pipelined ADC.

2. A method according to claim 1 further comprising steps of monitoring the sum of the generated binary modulation signal $b_{sc}$ bits and maintaining the average of the $b_{sc}$ bits near zero whereby the ADC calibration is performed more quickly.

* * * * *